United States Patent
Chen

(10) Patent No.: US 11,017,862 B2
(45) Date of Patent: May 25, 2021

(54) MULTI-TIME PROGRAMMING MEMORY CELL AND MEMORY CELL ARRAY WITH ERASE INHIBIT CAPABILITY

(71) Applicant: eMemory Technology Inc., Hsin-Chu (TW)

(72) Inventor: Chih-Hsin Chen, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 0 days.

(21) Appl. No.: 16/661,603

(22) Filed: Oct. 23, 2019

(65) Prior Publication Data
US 2020/0194079 A1    Jun. 18, 2020

Related U.S. Application Data

(60) Provisional application No. 62/778,900, filed on Dec. 13, 2018.

(51) Int. Cl.
*G11C 16/04* (2006.01)
*G11C 16/14* (2006.01)
*H01L 27/11519* (2017.01)
*H01L 27/11521* (2017.01)

(52) U.S. Cl.
CPC .......... *G11C 16/14* (2013.01); *G11C 16/0433* (2013.01); *H01L 27/11519* (2013.01); *H01L 27/11521* (2013.01)

(58) Field of Classification Search
CPC ..... G11C 16/14; G11C 16/16; G11C 16/0433; G11C 16/0408; G11C 16/0483; G11C 16/10; G11C 16/24; G11C 14/0018; H01L 27/11519; H01L 27/11521; H01L 27/11524; H01L 27/11536
See application file for complete search history.

(56) References Cited

U.S. PATENT DOCUMENTS

| | | | | |
|---|---|---|---|---|
| 4,845,680 A | * | 7/1989 | Iwahashi | G11C 16/0433 365/185.23 |
| 8,355,282 B2 | | 1/2013 | Ching et al. | |
| 9,659,951 B1 | * | 5/2017 | Kim | H01L 29/7883 |
| 2008/0006868 A1 | | 1/2008 | Hsu et al. | |

(Continued)

FOREIGN PATENT DOCUMENTS

KR    101459506 B1    11/2014

OTHER PUBLICATIONS

Search report issued by EPO dated May 18, 2020.

*Primary Examiner* — Uyen Smet
(74) *Attorney, Agent, or Firm* — WPAT, PC

(57) ABSTRACT

A multi-time programming memory cell includes a floating gate transistor, a first capacitor, a second capacitor and a third capacitor. The floating gate transistor has a floating gate. A first terminal of the floating gate transistor is coupled to a source line. A second terminal of the floating gate transistor is coupled to a bit line. A first terminal of the first capacitor is connected with the floating gate. A second terminal of the first capacitor is connected with an erase line. A first terminal of the second capacitor is connected with the floating gate. A second terminal of the second capacitor is connected with a control line. A first terminal of the third capacitor is connected with the floating gate. A second terminal of the third capacitor is connected with an inhibit line.

18 Claims, 7 Drawing Sheets

| | CL | IL | EL | SG | WL | SL | BL | PW |
|---|---|---|---|---|---|---|---|---|
| PGM | Vpp | Vpp | Vpp | 0 | Vdd | Vdd | 0 | 0 |
| PGM inhibit | Vpp | Vpp | Vpp | 0 | Vdd | Vdd | Vdd | 0 |
| ERS | 0 | 0 | Vee | 0 | Vdd/0 | Vdd | 0 | 0 |
| ERS inhibit | 0 | Vinh | Vee | 0 | Vdd/0 | Vdd | 0 | 0 |
| Read | 0 | 0 | 0 | Vdd | Vdd | 0 | Vr | 0 |

(56) References Cited

U.S. PATENT DOCUMENTS

2008/0251832 A1    10/2008  Chih et al.
2014/0361358 A1*   12/2014  Chen .................. G11C 16/0425
                                                       257/315

* cited by examiner

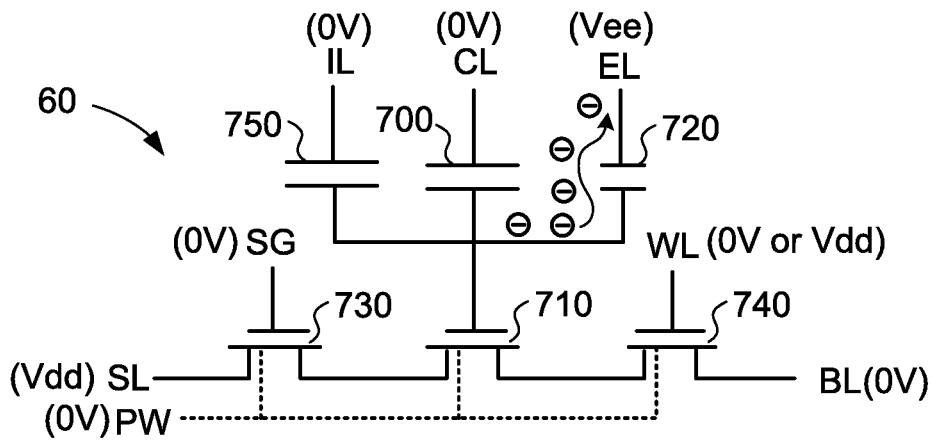
FIG. 3D
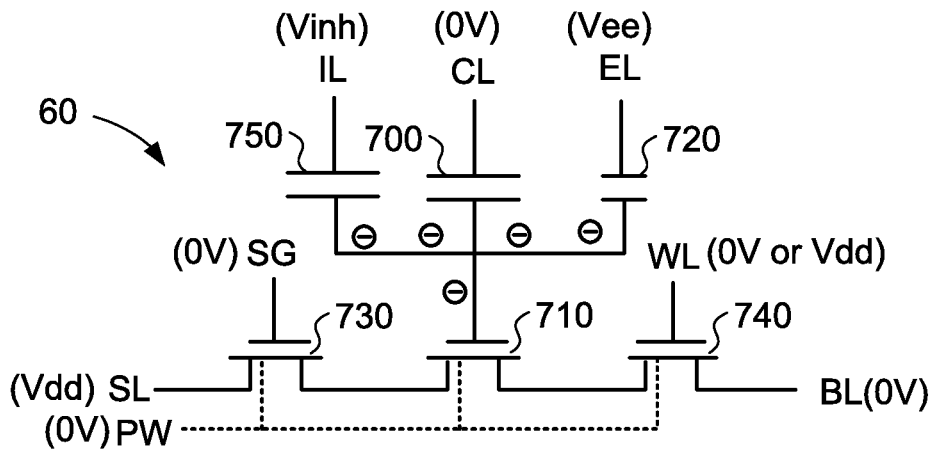
FIG. 3E
|  | CL | IL | EL | SG | WL | SL | BL | PW |
|---|---|---|---|---|---|---|---|---|
| PGM | Vpp | Vpp | Vpp | 0 | Vdd | Vdd | 0 | 0 |
| PGM inhibit | Vpp | Vpp | Vpp | 0 | Vdd | Vdd | Vdd | 0 |
| ERS | 0 | 0 | Vee | 0 | Vdd/0 | Vdd | 0 | 0 |
| ERS inhibit | 0 | Vinh | Vee | 0 | Vdd/0 | Vdd | 0 | 0 |
| Read | 0 | 0 | 0 | Vdd | Vdd | 0 | Vr | 0 |
FIG. 4A

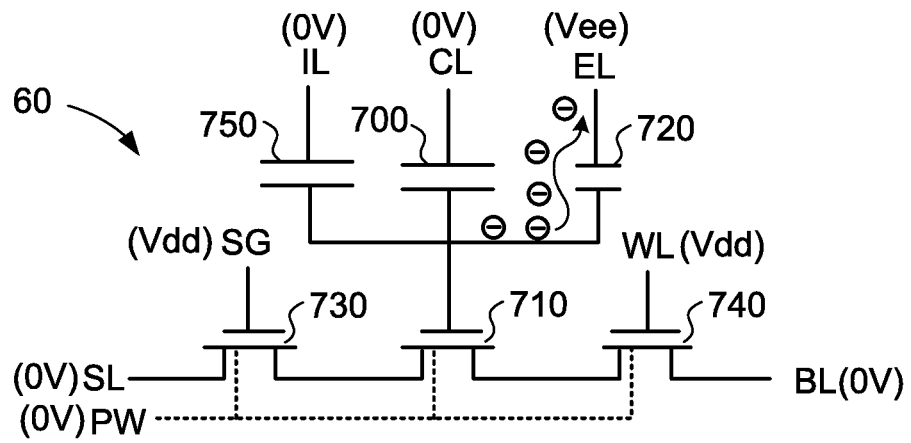
FIG. 5A
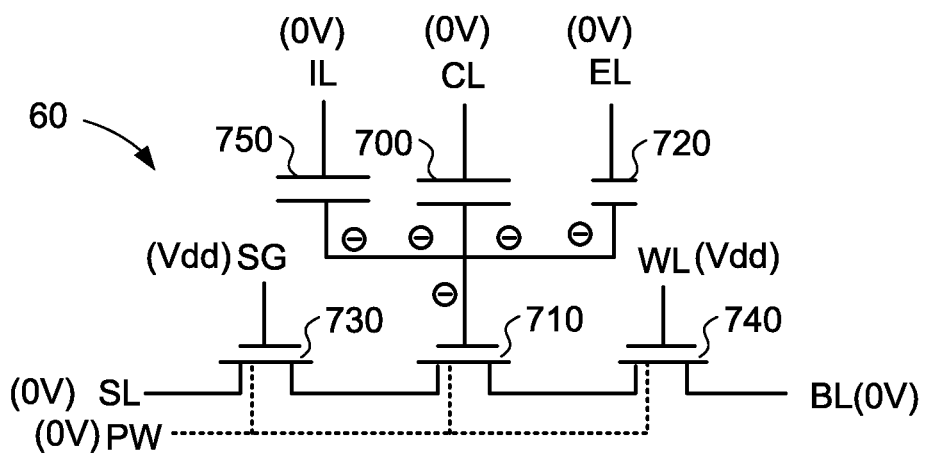
FIG. 5B
|  | CL | IL | EL | SG | WL | SL | BL | PW |
|---|---|---|---|---|---|---|---|---|
| PGM | Vpp | Vpp | Vpp | 0 | Vdd | Vdd | 0 | 0 |
| PGM inhibit | Vpp | Vpp | Vpp | 0 | Vdd | Vdd | Vdd | 0 |
| ERS | 0 | 0 | Vee | Vdd | Vdd | 0 | 0 | 0 |
| ERS inhibit | 0 | 0 | 0 | Vdd | Vdd | 0 | 0 | 0 |
| Read | 0 | 0 | 0 | Vdd | Vdd | 0 | Vr | 0 |
FIG. 6A

MULTI-TIME PROGRAMMING MEMORY CELL AND MEMORY CELL ARRAY WITH ERASE INHIBIT CAPABILITY This application claims the benefit of U.S. provisional application Ser. No. 62/778,900, filed Dec. 13, 2018, the subject matters of which are incorporated herein by reference.

FIELD OF THE INVENTION

The present invention relates to a memory cell and a memory array, and more particularly to a multi-time programming memory cell (also referred as a MTP memory cell) and a memory array with the erase inhibit capability.

BACKGROUND OF THE INVENTION

FIG. 1A is a schematic top view of a conventional MTP memory cell. FIG. 1B is a circuit diagram illustrating an equivalent circuit of the MTP memory cell as shown in FIG. 1A. The structure and the circuit of the conventional MTP memory cell are disclosed in U.S. Pat. No. 8,355,282.

Please refer to FIG. 1A. Firstly, a first N-well region NW1, a second N-well region NW2 and a P-well region PW are formed in a semiconductor substrate. Then, three gate structures 471, 400 and 472 are formed by polysilicon layers. The gate structure 400 is located over the first N-well region NW1, the second N-well region NW2 and the P-well region PW. The gate structures 471 and 472 are located over the P-well region PW. Moreover, the gate structures 471 and 472 are arranged beside two sides of the gate structure 400, respectively. The gate structure 400 is served as a floating gate (FG).

Then, n-doped regions 461, 462, 463 and 464 are formed in the P-well region PW. The n-doped region 461 is arranged beside a first side of the gate structure 471. The n-doped region 462 is arranged between a second side of the gate structure 471 and the gate structure 400. The n-doped region 463 is arranged between the gate structure 400 and a second side of the gate structure 472. The n-doped region 464 is arranged beside a first side of the gate structure 472.

Then, p-doped regions 421, 422, 481 and 482 are formed in the N-well regions NW1 and NW2. The p-doped regions 421 and 422 are formed in the second N-well region NW2. Moreover, the p-doped regions 421 and 422 are arranged beside two sides of the gate structure 400, respectively. The p-doped regions 481 and 482 are formed in the first N-well region NW1. Moreover, the p-doped regions 481 and 482 are arranged beside two sides of the gate structure 400, respectively.

After the above procedures, the MTP memory cell 40 is fabricated. The gate structure 471 is connected with a word line WL. The gate structure 472 is connected with a select gate line SG. The p-doped regions 421 and 422 are connected with a control line CL. The p-doped regions 481 and 482 are connected with an erase line EL. The n-doped region 461 is connected with a source line SL. The n-doped region 464 is connected with a bit line BL.

Please refer to FIG. 1B. A transistor 530 is defined by the n-doped region 461, the gate structure 471 and the n-doped region 462 collaboratively. A floating gate transistor 510 is defined by the n-doped region 462, the gate structure 400 and the n-doped region 463 collaboratively. A transistor 540 is defined by the n-doped region 463, the gate structure 472 and the n-doped region 464 collaboratively. A capacitor 500 is defined by the gate structure 400, the p-doped region 421 and the p-doped region 422. A capacitor 520 is defined by the gate structure 400, the p-doped region 481 and the p-doped region 482.

Please refer to the equivalent circuit of the MTP memory cell 40 as shown in FIG. 1B. The gate terminal of the transistor 530 is connected with the word line WL. The first terminal of the transistor 530 is connected with the source line SL. The second terminal of the transistor 530 is connected with the first terminal of the floating gate transistor 510. The gate terminal of the transistor 540 is connected with the select gate line SG. The first terminal of the transistor 540 is connected with the bit line BL. The second terminal of the transistor 540 is connected with the second terminal of the floating gate transistor 510.

The first terminal of the capacitor 500 is connected with the floating gate FG of the floating gate transistor 510. The second terminal of the capacitor 500 is connected with the control line CL. The first terminal of the capacitor 520 is connected with the floating gate FG of the floating gate transistor 510. The second terminal of the capacitor 520 is connected with the erase line EL.

In the conventional MTP memory cell 40, the gate structure 400 is used as the floating gate FG of the floating gate transistor 510. In addition, the gate structure 400 also comprises a coupling gate and an erase gate. The active region of the coupling gate is arranged between the p-doped regions 421 and 422. The active region of the floating gate FG is arranged between the n-doped regions 462 and 463. The active region of the erase gate is arranged between the p-doped regions 481 and 482. Generally, the area of the active region of the coupling gate is larger than the area of the active region of the floating gate FG, and the area of the active region of the floating gate FG is larger than the area of the active region of the erase gate. For example, the area of the active region of the coupling gate, the area of the active region of the floating gate FG and the area of the active region of the erase gate are 85%, 10% and 5% of the total area of the gate structure 400, respectively.

After proper bias voltages are provided to the MTP memory cell 40, a program operation, a program inhibit operation, an erase operation or a read operation can be selectively performed on the MTP memory cell 40. However, the conventional MTP memory cell 40 does not have the erase inhibit capability. That is, the erase inhibit operation cannot be performed on the conventional MTP memory cell 40.

SUMMARY OF THE INVENTION

An embodiment of the present invention provides a multi-time programming memory cell. The multi-time programming memory cell includes a floating gate transistor, a first capacitor, a second capacitor and a third capacitor. The floating gate transistor has a floating gate. A first terminal of the floating gate transistor is coupled to a source line. A second terminal of the floating gate transistor is coupled to a bit line. A first terminal of the first capacitor is connected with the floating gate. A second terminal of the first capacitor is connected with an erase line. A first terminal of the second capacitor is connected with the floating gate. A second terminal of the second capacitor is connected with a control line. A first terminal of the third capacitor is connected with the floating gate. A second terminal of the third capacitor is connected with an inhibit line.

Another embodiment of the present invention provides a multi-time programming memory cell. The multi-time programming memory cell includes a first well region, a second well region, a third well region, a fourth well region, a first gate structure, a second gate structure, a third gate structure, a first doped region, a second doped region, a third doped region, a fourth doped region, a fifth doped region, a sixth doped region, a seventh doped region, an eighth doped region, a ninth doped region and a tenth doped region. The first gate structure is located over the fourth well region. The second gate structure is located over the first well region, the second well region, the third well region and the fourth well region. The third gate structure is located over the fourth well region. The first doped region, the second doped region, the third doped region and the fourth doped region are formed in the fourth well region. The first doped region is arranged beside the first gate structure. The second doped region is arranged between the first gate structure and the second gate structure. The third doped region is arranged between the second gate structure and the third gate structure. The fourth doped region is arranged beside the third gate structure. The fifth doped region and the sixth doped region are formed in the first well region. The fifth doped region and the sixth doped region are arranged beside two sides of the second gate structure, respectively. The fifth doped region and the sixth doped region are connected with an erase line. The seventh doped region and the eighth doped region are formed in the second well region. The seventh doped region and the eighth doped region are arranged beside the two sides of the second gate structure, respectively. The seventh doped region and the eighth doped region are connected with a control line. The ninth doped region and the tenth doped region are formed in the third well region. The ninth doped region and the tenth doped region are arranged beside the two sides of the second gate structure, respectively. The ninth doped region and the tenth doped region are connected with an inhibit line.

Another embodiment of the present invention provides a memory cell array. The memory cell array includes a first row of M multi-time programming memory cells. The M multi-time programming memory cells in the first row are connected with a first select gate line, a first word line, a first control line and a first erase line. The M multi-time programming memory cells in the first row are respectively connected with corresponding M source lines. The M multi-time programming memory cells in the first row are respectively connected with corresponding M bit lines. Moreover, N multi-time programming memory cells of the M multi-time programming memory cells in the first row are connected with a first inhibit line, and (N-M) multi-time programming memory cells of the M multi-time programming memory cells in the first row are connected with a second inhibit line.

Another embodiment of the present invention provides a memory cell array. The memory cell array includes a first row of M multi-time programming memory cells. The M multi-time programming memory cells in the first row are connected with a first select gate line, a first word line and a first control line. The M multi-time programming memory cells in the first row are respectively connected with corresponding M source lines. The M multi-time programming memory cells in the first row are respectively connected with corresponding M bit lines. Moreover, N multi-time programming memory cells of the M multi-time programming memory cells in the first row are connected with a first inhibit line and a first erase line, and (N-M) multi-time programming memory cells of the M multi-time programming memory cells in the first row are connected with a second inhibit line and a second erase line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 3A to 3E schematically illustrate associated bias voltages for performing associated operations on the MTP memory cell according to the embodiment of the present invention. The P-well region PW receives a ground voltage (0V);

FIG. 4A is a table illustrating associating voltages for performing a program operation, a program inhibit operation, an erase operation, an erase inhibit operation and a read operation on a memory array cell according to a first embodiment of the present invention;

FIGS. 5A and 5B schematically illustrate associated bias voltages for performing the erase operation and the erase inhibit operation on the MTP memory cell according to another embodiment of the present invention;

FIG. 6A is a table illustrating associating voltages for performing a program operation, a program inhibit operation, an erase operation, an erase inhibit operation and a read operation on a memory array cell according to a second embodiment of the present invention.

DETAILED DESCRIPTION OF PREFERRED EMBODIMENTS

Figure 1A:
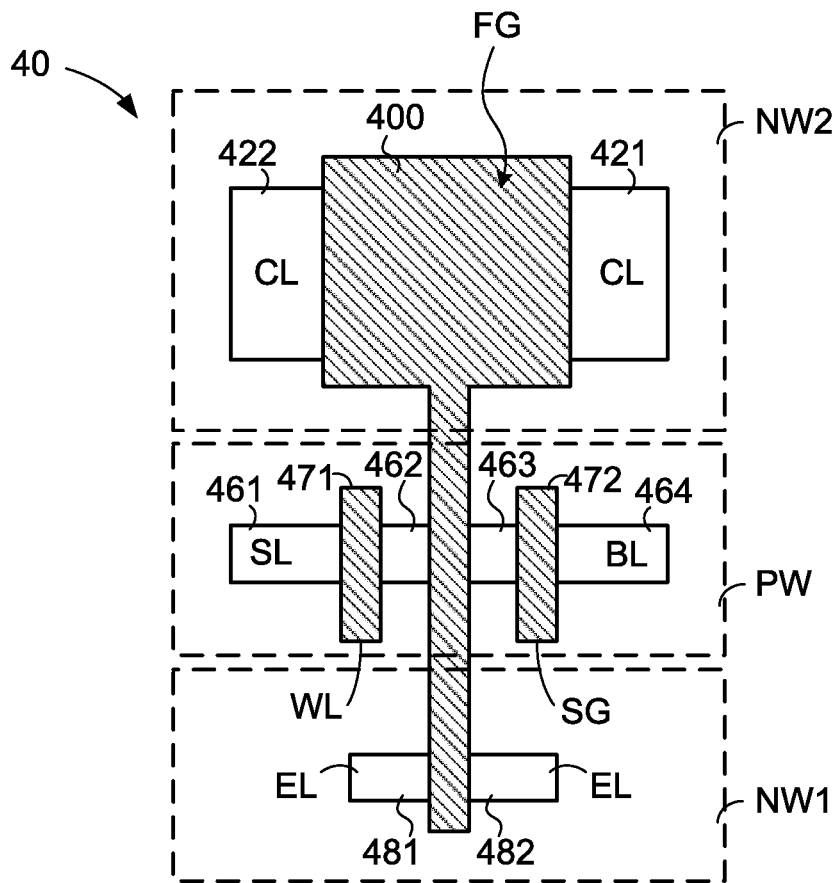
FIG. 1A (prior art) is a schematic top view of a conventional MTP memory cell.
Figure 1B:
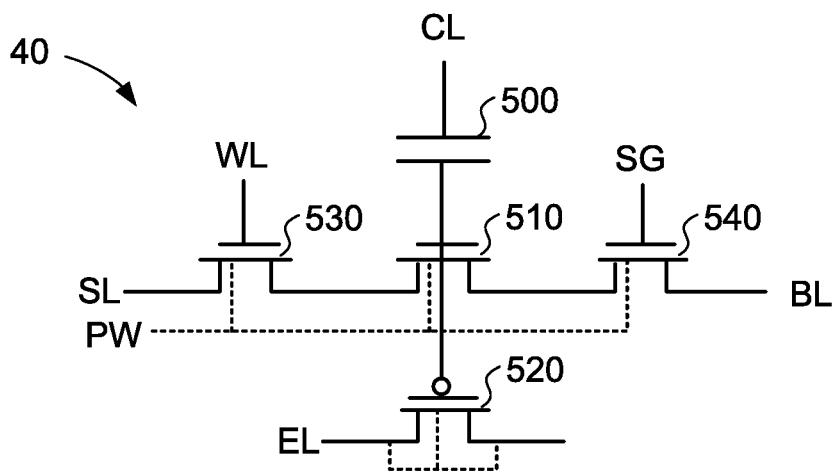
FIG. 1B (prior art) is a circuit diagram illustrating an equivalent circuit of the MTP memory cell as shown in FIG. 1A.
Figure 2A:
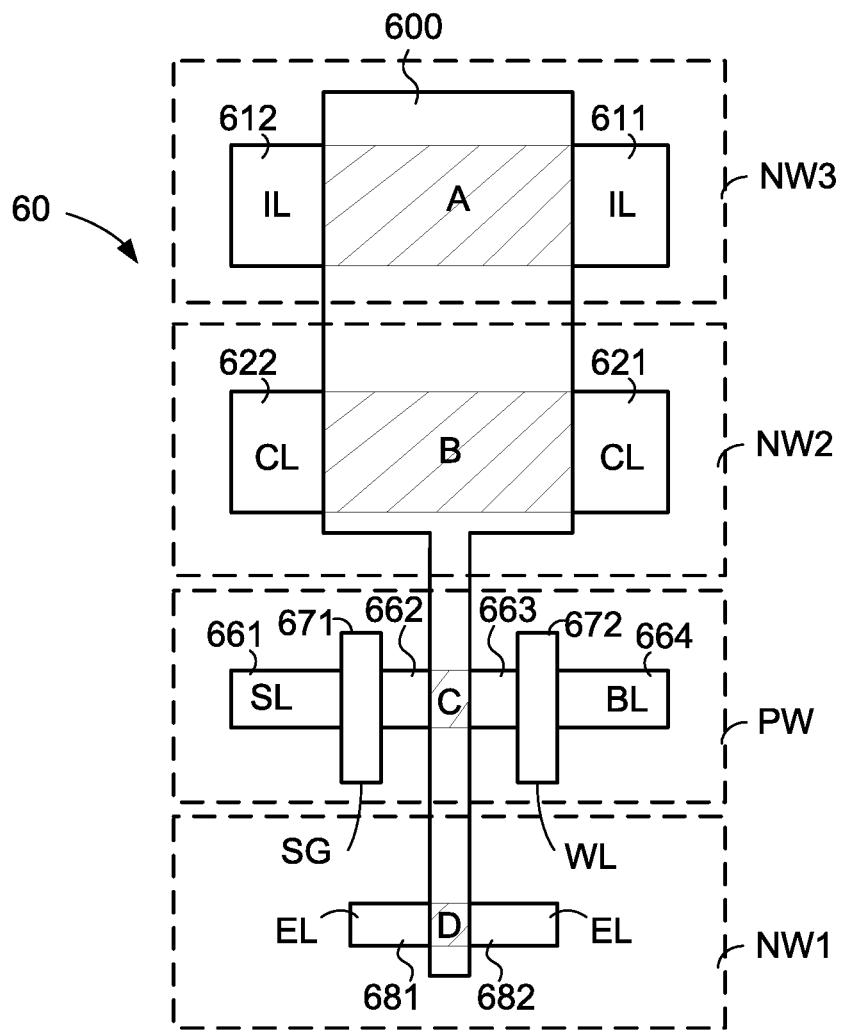
FIG. 2A is a schematic top view illustrating a MTP memory cell according to an embodiment of the present invention.
Figure 2B:
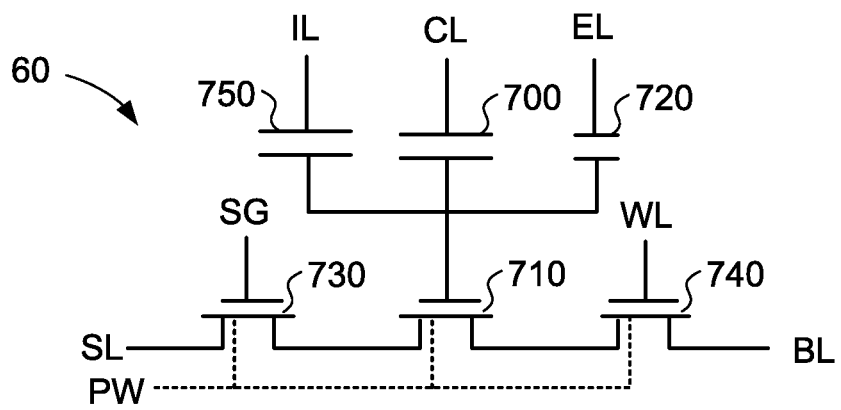
FIG. 2B is a circuit diagram illustrating an equivalent circuit of the MTP memory cell as shown in FIG. 2A.

FIG. 2A is a schematic top view illustrating a MTP memory cell according to an embodiment of the present invention. FIG. 2B is a circuit diagram illustrating an equivalent circuit of the MTP memory cell as shown in FIG. 2A.

Please refer to FIG. 2A. Firstly, a first N-well region NW1, a second N-well region NW2, a third N-well region NW3 and a P-well region PW are formed in a semiconductor substrate. Then, a polysilicon layer is employed to form three gate structures 671, 600 and 672. The gate structure 600 is located over the first N-well region NW1, the second N-well region NW2, the third N-well region NW3 and the P-well region PW. The gate structures 671 and 672 are located over the P-well region PW. Moreover, the gate structures 671 and 672 are arranged beside two sides of the gate structure 600, respectively.

Then, n-doped regions 661, 662, 663 and 664 are formed in the P-well region PW. The n-doped region 661 is arranged beside a first side of the gate structure 671. The n-doped region 662 is arranged between a second side of the gate structure 671 and the gate structure 600. The n-doped region 663 is arranged between the gate structure 600 and a second side of the gate structure 672. The n-doped region 664 is arranged beside a first side of the gate structure 672.

Then, p-doped regions 611. 612, 621, 622, 681 and 682 are formed in the N-well regions NW1, NW2 and NW3. The p-doped regions 621 and 622 are formed in the second N-well region NW2. Moreover, the p-doped regions 621 and 622 are arranged beside two sides of the gate structure 600, respectively. The p-doped regions 681 and 682 are formed in the first N-well region NW1. Moreover, the p-doped regions 681 and 682 are arranged beside two sides of the gate structure 600, respectively. The p-doped regions 611 and 612 are formed in the third N-well region NW3. Moreover, the p-doped regions 611 and 612 are arranged beside two sides of the gate structure 600, respectively.

After the above procedures, the MTP memory cell 60 is fabricated. The gate structure 671 is connected with a select gate line SG . The gate structure 672 is connected with a word line WL. The p-doped regions 621 and 622 are connected with a control line CL. The p-doped regions 681 and 682 are connected with an erase line EL. The p-doped regions 611 and 612 are connected with an inhibit line IL. The n-doped region 661 is connected with a source line SL. The n-doped region 664 is connected with a bit line BL.

Please refer to FIG. 2B. A transistor 730 is defined by the n-doped region 661, the gate structure 671 and the n-doped region 662 collaboratively. A floating gate transistor 710 is defined by the n-doped region 662, the gate structure 600 and the n-doped region 663 collaboratively. A transistor 740 is defined by the n-doped region 663, the gate structure 672 and the n-doped region 664 collaboratively. A capacitor 700 is defined by the gate structure 600, the p-doped region 621 and the p-doped region 622. A capacitor 720 is defined by the gate structure 600, the p-doped region 681 and the p-doped region 682. A capacitor 750 is defined by the gate structure 600, the p-doped region 611 and the p-doped region 612.

Please refer to the equivalent circuit of the MTP memory cell 60 as shown in FIG. 2B. The gate terminal of the transistor 730 is connected with the select gate line SG. The first terminal of the transistor 730 is connected with the source line SL. The second terminal of the transistor 730 is connected with the first terminal of the floating gate transistor 710. The gate terminal of the transistor 740 is connected with the word line WL. The first terminal of the transistor 740 is connected with the bit line BL. The second terminal of the transistor 740 is connected with is connected with the second terminal of the floating gate transistor 710.

The first terminal of the capacitor 700 is connected with the floating gate FG of the floating gate transistor 710. The second terminal of the capacitor 700 is connected with the control line CL. The first terminal of the capacitor 720 is connected with the floating gate FG of the floating gate transistor 710. The second terminal of the capacitor 720 is connected with the erase line EL. The first terminal of the capacitor 750 is connected with the floating gate FG of the floating gate transistor 710. The second terminal of the capacitor 750 is connected with the inhibit line IL.

In the MTP memory cell 60, the gate structure 600 comprises a floating gate, a coupling gate, an erase gate and an inhibit gate. The active region A of the inhibit gate is arranged between the p-doped regions 611 and 612. The active region B of the coupling gate is arranged between the p-doped regions 621 and 622. The active region C of the floating gate is arranged between the n-doped regions 662 and 663. The active region D of the erase gate is arranged between the p-doped regions 681 and 682. In an embodiment, the area of the active region A of the inhibit gate is substantially equal to the area of the active region B of the coupling gate, In an embodiment, the area of the active region B of the coupling gate is larger than the area of the active region C of the floating gate, and the area of the active region C of the floating gate is larger than the area of the active region D of the erase gate. For example, the areas of the active regions A, B, C and D are 43%, 43, 10% and 4% of the total area of the gate structure 600, respectively.

After proper bias voltages are provided to the MTP memory cell 60, a program operation, a program inhibit operation, an erase operation, an erase inhibit operation or a read operation can be selectively performed on the MTP memory cell 60. The method of performing these operations will be described as follows.

FIGS. 3A to 3E schematically illustrate associated bias voltages for performing associated operations on the MTP memory cell according to the embodiment of the present invention. The P-well region PW receives a ground voltage (0V).

Figure 3A:
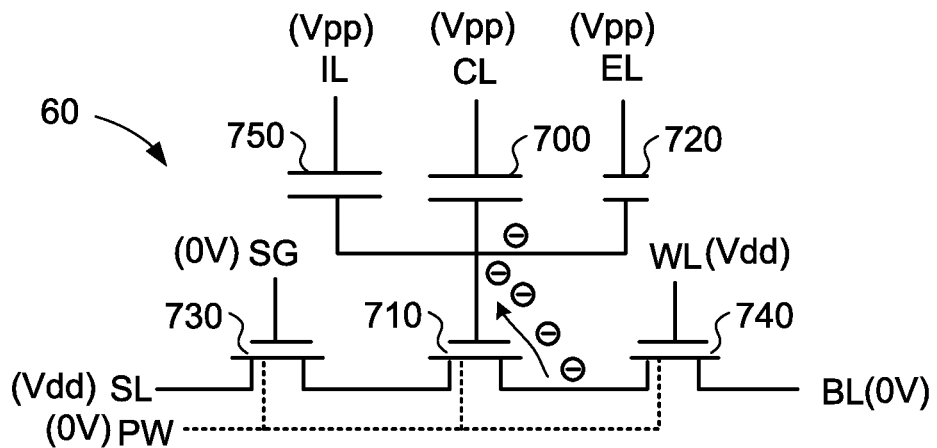
Figure 3B:
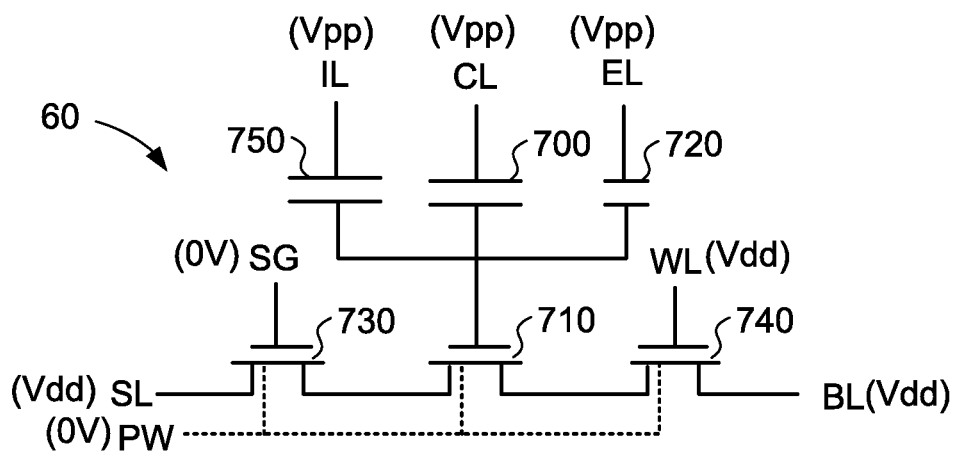

Please refer to FIGS. 3A and 3B. When the ground voltage (0V) is provided to the select gate line SG and a first power voltage Vdd is provided to the word line WL, the MTP memory cell 60 is the selected cell. According to the voltages provided to the source line SL, the bit line BL, the erase line EL, the control line CL and the inhibit line IL, the program operation or the program inhibit operation is selectively performed on the selected cell.

Please refer to FIG. 3A. The first power voltage Vdd is provided to the word line WL. The ground voltage (0V) is provided to the bit line BL. A program voltage Vpp is provided to the erase line EL, the control line CL and the inhibit line IL. Under this circumstance, the floating gate is coupled to a first coupling voltage. The first coupling voltage is close to the program voltage Vpp. Since the bit line BL receives the ground voltage (0V), the voltage difference between the two sides of the gate oxide layer of the floating gate transistor 710 is generated. Due to the voltage difference, electrons are injected into the floating gate. Meanwhile, the MTP memory cell 60 undergoes the program operation.

Please refer to FIG. 3B. The first power voltage Vdd is provided to the source line SL. The first power voltage Vdd is provided to the bit line BL. The program voltage Vpp is provided to the erase line EL, the control line CL and the inhibit line IL. Under this circumstance, the floating gate is coupled to the first coupling voltage. The first coupling voltage is close to the program voltage Vpp. Since the bit line BL receives the first power voltage Vdd, the voltage difference between the two sides of the gate oxide layer of the floating gate transistor 710 cannot allow the electrons to be ejected from the floating gate. Meanwhile, the MTP memory cell 60 undergoes the program inhibit operation.

In this embodiment, the magnitude of the program voltage Vpp is higher than the magnitude of the first power voltage Vdd. For example, the program voltage Vpp is 10V, and the first power voltage Vdd is 5V.

Figure 3C:
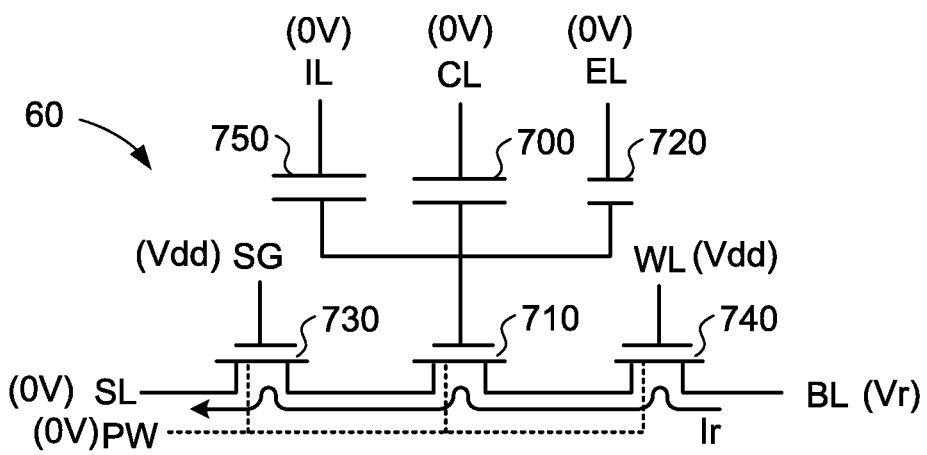

Please refer to FIG. 3C. When the first power voltage Vdd is applied to the select gate line SG and the word line WL, the transistors 730 and 740 are turned on and the MTP memory cell 60 is the selected cell. According to the voltages provided to the source line SL, the bit line BL, the erase line EL, the control line CL and the inhibit line IL, the read operation is performed on the selected cell.

The ground voltage (0V) is provided to the erase line EL, the control line CL, the inhibit line IL and the source line SL. A read voltage Vr is provided to the bit line BL. Consequently, the selected cell generates a read current, and the read current flows from the bit line BL to the source line SL. During the read cycle, the storage state of the selected cell can be judged according to the magnitude of the current flowing through the bit line BL. In an embodiment, a sense amplifier is connected with the bit line BL. If the electrons are stored in the floating gate, the magnitude of the read current is lower and the sense amplifier judges that the MTP memory cell 60 is in a first storage state. Whereas, if no electrons are stored in the floating gate, the magnitude of the read current is higher and the sense amplifier judges that the MTP memory cell 60 is in a second storage state.

Please refer to FIGS. 3D and 3E. When the ground voltage (0V) is provided to the select gate line SG and the first power voltage Vdd or the ground voltage (0V) is provided to the word line WL, the MTP memory cell 60 is the selected cell. According to the voltages provided to the source line SL, the bit line BL, the erase line EL, the control line CL and the inhibit line IL, the erase operation or the erase inhibit operation is selectively performed on the selected cell.

Please refer to FIG. 3D. The first power voltage Vdd is provided to the source line SL. The ground voltage (0V) is provided to the bit line BL. An erase voltage Vee is provided to the erase line EL. The ground voltage (0V) is provided to the control line CL and the inhibit line IL. Since the area of the active region of the inhibit gate and the area of the active region of the coupling gate are larger than the area of the active region of the erase gate, the floating gate is coupled to a second coupling voltage. The second coupling voltage is close to the ground voltage (0V). Since the erase line EL receives the erase voltage Vee, the voltage difference between the two sides of the gate oxide layer of the erase gate is generated. Due to the voltage difference, electrons are ejected from the floating gate through the capacitor 720. Meanwhile, the MTP memory cell 60 undergoes the erase operation.

Please refer to FIG. 3E. The first power voltage Vdd is provided to the source line SL. The ground voltage (0V) is provided to the bit line BL. The erase voltage Vee is provided to the erase line EL. An inhibit voltage Vinh is provided to the inhibit line IL. The ground voltage (0V) is provided to the control line CL. Since the area of the active region of the inhibit gate is close to the area of the active region of the coupling gate, the floating gate is coupled to a third coupling voltage. The magnitude of the third coupling voltage is higher than the magnitude of the second coupling voltage. Since the erase line EL receives the erase voltage Vee, the voltage difference between the two sides of the gate oxide layer of the erase gate cannot allow the electrons to be ejected from the floating gate. Meanwhile, the MTP memory cell 60 undergoes the erase inhibit operation.

In this embodiment, the magnitude of the erase voltage Vee is higher than the magnitude of the inhibit voltage Vinh. For example, the erase voltage Vee is 10V, and the inhibit voltage Vinh is 5V.

Figure 4B:
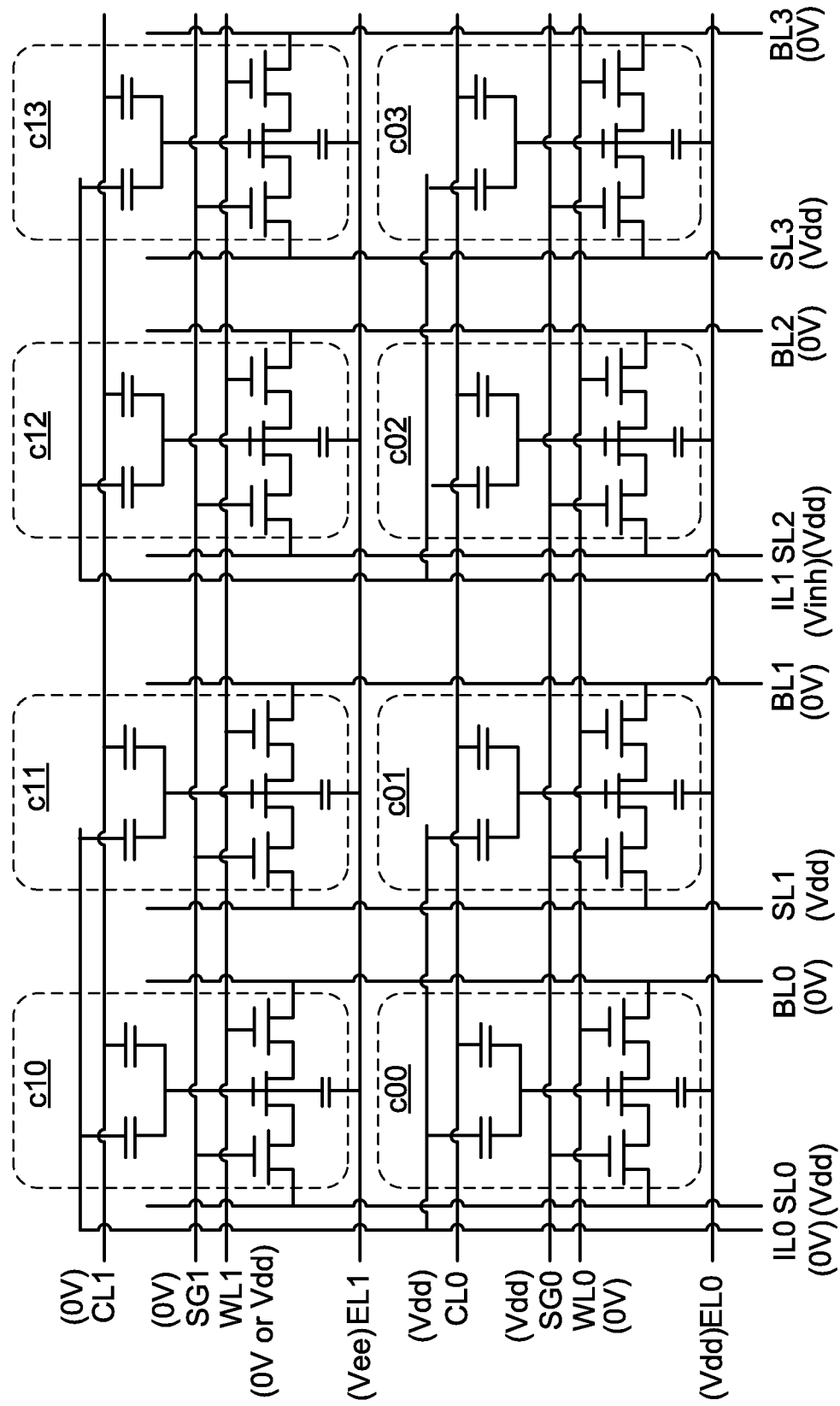
FIG. 4B is a schematic circuit diagram illustrating the memory array cells according to the first embodiment of the present invention.

FIG. 4A is a table illustrating associating voltages for performing a program operation, a program inhibit operation, an erase operation, an erase inhibit operation and a read operation on a memory array cell according to a first embodiment of the present invention. FIG. 4B is a schematic circuit diagram illustrating the memory array cells according to the first embodiment of the present invention.

As shown in FIG. 4B, the memory cell array 800 comprises MTP memory cells c00~c13 in a 2×4 array. The four MTP memory cells c00~c03 in the first row are all connected with a word line WL0, a select gate line SG0, an erase line EL0 and a control line CL0. Moreover, the four MTP memory cells c00~c03 in the first row are connected with the corresponding source lines SL0~SL3 and corresponding bit lines BL0~BL3, respectively. The MTP memory cell c00 is connected with the source line SL0 and the bit lines BL0. The MTP memory cell c01 is connected with the source line SL1 and the bit lines BL1. The MTP memory cell c02 is connected with the source line SL2 and the bit lines BL2. The MTP memory cell c03 is connected with the source line SL3 and the bit lines BL3.

Moreover, the four MTP memory cells c00~c03 in the first row are divided into two groups. The two groups are connected with the inhibit lines IL0 and IL1. The MTP memory cells c00 and c01 of the first group are connected with the inhibit line IL0, respectively. The MTP memory cells c02 and c03 of the second group are connected with the inhibit line IL1. Similarly, the four MTP memory cells c10~c13 in the second row are divided into two groups. The MTP memory cells c10 and c11 of the first group are connected with the inhibit line IL0. The MTP memory cells c12 and c13 of the second group are connected with the inhibit line IL1.

In the memory cell array 800, each row comprises four MTP memory cells. It is noted that the number of the MTP memory cells in each row is not restricted. That is, each row of the memory cell array 800 can be connected with more MTP memory cells. For example, each row of the memory cell array 800 comprises M MTP memory cells. The M MTP memory cells are connected with the same word line WL, the same select gate line SG, the same erase line EL and the same control line CL. Moreover, the M MTP memory cells are connected with M source lines SL and M bit lines BL, respectively. Moreover, the M MTP memory cells are divided into two groups. The N MTP memory cells of the first group are connected with the inhibit line IL0. The (M-N) MTP memory cells of the second group are connected with the inhibit line IL1. For example, M is 32, and N is 16.

Please refer to FIG. 4B. The ground voltage (0V) is provided to the select gate line SG1. The first power voltage Vdd or the ground voltage (0V) is provided to the word line WL1. Consequently, the corresponding row is the selected row, and the MTP memory cells c10~c13 in the selected row are the selected cells. The first power voltage Vdd is provided to the select gate line SG0. The ground voltage (0V) is provided to the word line WL0. Consequently, the corresponding row is the non-selected row, and no operations are performed on the MTP memory cells c00~c03 in the non-selected row.

The first power voltage Vdd is provided to the source lines SL0~SL3. The ground voltage (0V) is provided to the bit lines BL0~BL3. The erase voltage Vee is provided to the erase line EL1. The ground voltage (0V) is provided to the control line CL1. Consequently, the erase operation or the erase inhibit operation is selectively performed on the MTP memory cells c10~c13 in the selected row according to the voltages provided to the inhibit lines IL0 and IL1.

The ground voltage (0V) is provided to the inhibit line IL0. The inhibit voltage Vinh is provided to the inhibit line IL1. Consequently, the erase operation is performed on the MTP memory cells c10 and c11 of the first group of the selected row, and the erase inhibit operation is performed on the MTP memory cells c12 and c13 of the second group of the selected row.

The program operation, the program inhibit operation and the read operation can be performed on the MTP memory cells of the memory cell array 800 according to the bias voltage as shown in FIG. 4A.

It is noted that the bias voltages for performing the erase operation and the erase inhibit operation are not restricted.

FIGS. 5A and 5B schematically illustrate associated bias voltages for performing the erase operation and the erase inhibit operation on the MTP memory cell according to another embodiment of the present invention. The ground voltage (0V) is provided to the P-well region PW.

When the first power voltage Vdd is provided to the select gate line SG and the word line WL, the MTP memory cell 60 is the selected cell. According to the voltages provided to the source line SL, the bit line BL, the erase line EL, the control line CL and the inhibit line IL, the erase operation or the erase inhibit operation is selectively performed on the selected cell.

Please refer to FIG. 5A. The ground voltage (0V) is provided to the source line SL and the bit line BL. The erase voltage Vee is provided to the erase line EL. The ground voltage (0V) is provided to the control line CL and the inhibit line IL. Since the area of the active region of the inhibit gate and the area of the active region of the coupling gate are larger than the area of the active region of the erase gate, the floating gate is coupled to a fourth coupling voltage. The fourth coupling voltage is close to the ground voltage (0V). Since the erase line EL receives the erase voltage Vee, the voltage difference between the two sides of the gate oxide layer of the erase gate is generated. Due to the voltage difference, electrons are ejected from the floating gate through the capacitor 720. Meanwhile, the MTP memory cell 60 undergoes the erase operation.

Please refer to FIG. 5B. The ground voltage (0V) is provided to the source line SL, the bit line BL, the erase line EL, the inhibit line IL and the control line CL. Consequently, no electrons are ejected from the floating gate. Meanwhile, the MTP memory cell 60 undergoes the erase inhibit operation.

Figure 6B:
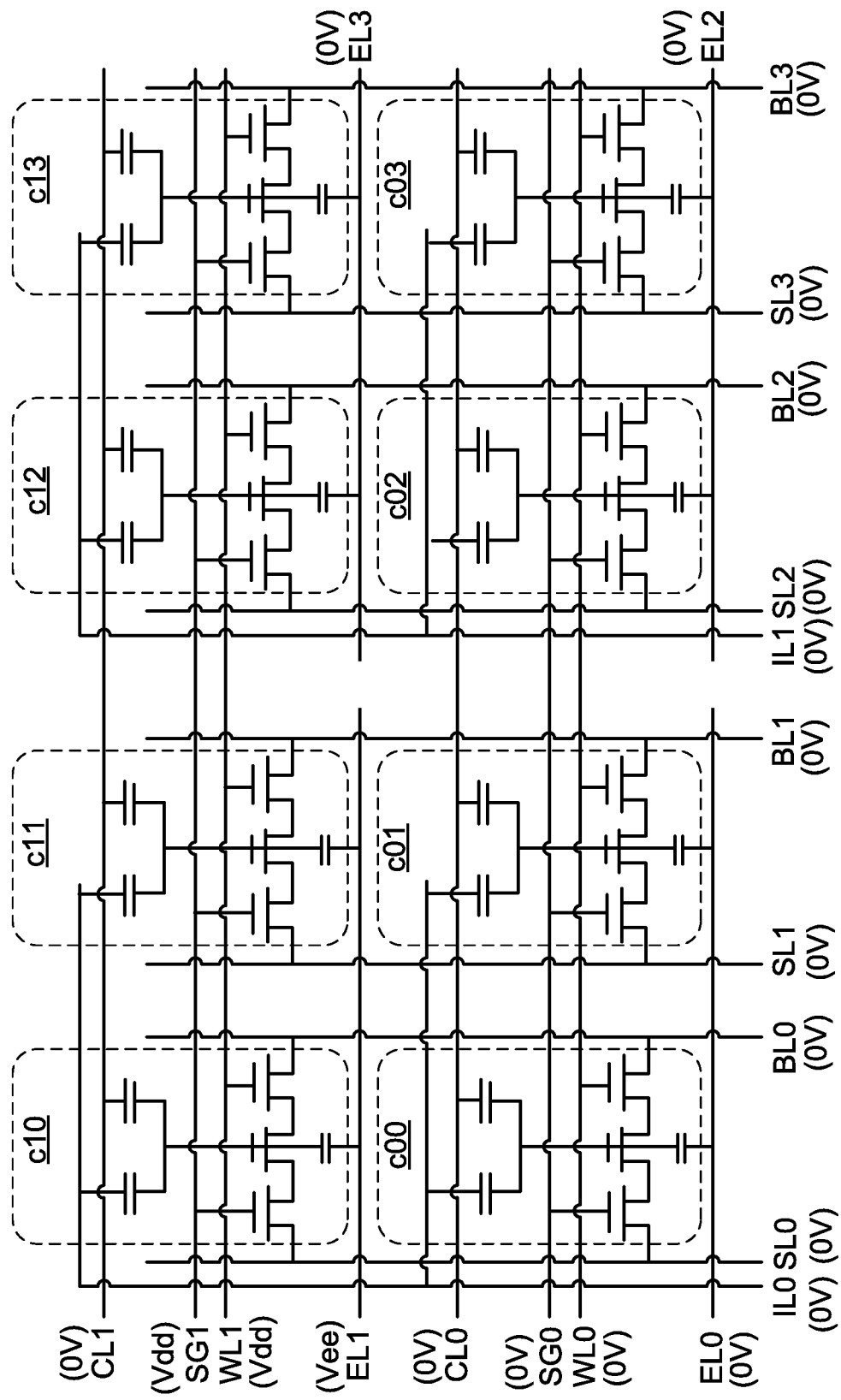
FIG. 6B is a schematic circuit diagram illustrating the memory array cells according to the second embodiment of the present invention.

FIG. 6A is a table illustrating associating voltages for performing a program operation, a program inhibit operation, an erase operation, an erase inhibit operation and a read operation on a memory array cell according to a second embodiment of the present invention. FIG. 6B is a schematic circuit diagram illustrating the memory array cells according to the second embodiment of the present invention.

As shown in FIG. 6B, the memory cell array 850 comprises MTP memory cells c00~c13 in a 2×4 array. The four MTP memory cells c00~c03 in the first row are all connected with a word line WL0, a select gate line SG0, an erase line EL0 and a control line CL0. Moreover, the four MTP memory cells c00~c03 in the first row are connected with the corresponding source lines SL0~SL3 and corresponding bit lines BL0~BL3, respectively. The MTP memory cell c00 is connected with the source line SL0 and the bit lines BL0. The MTP memory cell c01 is connected with the source line SL1 and the bit lines BL1. The MTP memory cell c02 is connected with the source line SL2 and the bit lines BL2. The MTP memory cell c03 is connected with the source line SL3 and the bit lines BL3.

Moreover, the four MTP memory cells c00~c03 in the first row are divided into two groups. The two groups are connected with the inhibit lines IL0 and IL1, respectively. Moreover, the two groups are connected with the erase lines EL0 and EL2, respectively. The MTP memory cells c00 and c01 of the first group are connected with the inhibit line IL0 and the erase line EL0. The MTP memory cells c02 and c03 of the second group are connected with the inhibit line IL1 and the erase line EL2. Similarly, the four MTP memory cells c10~c13 in the second row are divided into two groups. The MTP memory cells c10 and c11 of the first group are connected with the inhibit line IL0 and the erase line EL1. The MTP memory cells c12 and c13 of the second group are connected with the inhibit line IL1 and the erase line EL3.

In the memory cell array 850, each row comprises four MTP memory cells. It is noted that the number of the MTP memory cells in each row is not restricted. That is, each row of the memory cell array 850 can be connected with more MTP memory cells. For example, each row of the memory cell array 850 comprises M MTP memory cells. Moreover, the M MTP memory cells are divided into two groups. The N MTP memory cells of the first group are connected with the inhibit line IL0 and the erase line EL1. The (M-N) MTP memory cells of the second group are connected with the inhibit line IL1 and the erase line EL3. The numbers M and N are integers.

Please refer to FIG. 6B. The first power voltage Vdd is provided to the select gate line SG1 and the word line WL1. Consequently, the corresponding row is the selected row, and the MTP memory cells c10~c13 in the selected row are the selected cells. The ground voltage (0V) is provided to the select gate line SG0 and the word line WL0. Consequently, the corresponding row is the non-selected row, and no operations are performed on the MTP memory cells c00~c03 in the non-selected row.

The ground voltage (0V) is provided to the source lines SL0~SL3, the bit lines BL0~BL3, the inhibit lines IL0~IL1 and the control line CL1. Consequently, the erase operation or the erase inhibit operation is selectively performed on the MTP memory cells c10~c13 in the selected row according to the voltages provided to the erase lines ED and EL3.

The erase voltage Vee is provided to the erase line EL1. The ground voltage (0V) is provided to the erase line EL3. Consequently, the erase operation is performed on the MTP memory cells c10 and c11 of the first group of the selected row, and the erase inhibit operation is performed on the MTP memory cells c12 and c13 of the second group of the selected row.

The program operation, the program inhibit operation and the read operation can be performed on the MTP memory cells of the memory cell array 850 according to the bias voltage as shown in FIG. 6A.

In the above embodiments, the three transistors 730, 710 and 740 of the MTP memory cell are serially connected between the source line SL and the bit line BL. It is noted that numerous modifications and alterations may be made while retaining the teachings of the invention. In another embodiment, only two transistors of the MTP memory cell are serially connected between the source line SL and the bit line BL. For example, a select transistor and a floating gate transistor are serially connected between the source line SL and the bit line BL. The gate terminal of the select transistor is connected with the select gate line SG. Moreover, three capacitors are connected between the floating gate and the erase line EL, the control line CL and the inhibit line IL. Alternatively, a floating gate transistor and a select transistor are serially connected between the source line SL and the bit line BL. The gate terminal of the select transistor is connected with the word line WL. Moreover, three capacitors are connected between the floating gate and the erase line EL, the control line CL and the inhibit line IL.

In the above embodiments, the three transistors 730, 710 and 740 of the MTP memory cell are n-type transistors that are constructed on the P-well regions. It is noted that numerous modifications and alterations may be made while retaining the teachings of the invention. For example, in another embodiment, the three transistors are p-type transistors that are constructed on the N-well regions. In this situation, the three N-well regions NW1, NW2 and NW3 are replaced by three P-well regions or other type of well regions.

From the above descriptions, the present invention provides a MTP memory cell and a memory array with the erase inhibit capability. By providing proper bias voltages, the erase operation or the erase inhibit operation is selectively performed on the MTP memory cell. Similarly, by providing proper bias voltages, portions of memory cells in the selected row of the memory array undergo the erase operation and other portions of memory cells in the selected row of the memory array undergo the erase inhibit operation.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multi-time programming memory cell, comprising:
   a floating gate transistor with a floating gate;
   a first transistor, wherein a first terminal of the first transistor is connected with a source line, a second terminal of the first transistor is connected with a first terminal of the floating gate transistor, and a gate terminal of the first transistor is connected with a select gate line;
   a second transistor, wherein a first terminal of the second transistor is connected with a second terminal of the floating gate transistor, a second terminal of the second transistor is connected with a bit line, and a gate terminal of the second transistor is connected with a word line;
   a first capacitor, wherein a first terminal of the first capacitor is connected with the floating gate, and a second terminal of the first capacitor is connected with an erase line;
   a second capacitor, wherein a first terminal of the second capacitor is connected with the floating gate, and a second terminal of the second capacitor is connected with a control line; and
   a third capacitor, wherein a first terminal of the third capacitor is connected with the floating gate, and a second terminal of the third capacitor is connected with an inhibit line;
   wherein while an erase operation is performed on the multi-time programming memory cell, the source line receives a first power voltage, the bit line receives a ground voltage, the select gate line receives the ground voltage, the word line receives the ground voltage or the first power voltage, the inhibit line receives the ground voltage, the control line receives the ground voltage, and the erase line receives an erase voltage, wherein a magnitude of the erase voltage is higher than a magnitude of the first power voltage, and the magnitude of the first power voltage is higher than a magnitude of the ground voltage.

2. The multi-time programming memory cell as claimed in claim 1, wherein while an erase inhibit operation is performed on the multi-time programming memory cell, the source line receives the first power voltage, the bit line receives the ground voltage, the select gate line receives the ground voltage, the word line receives the ground voltage or the first power voltage, the inhibit line receives an inhibit voltage, the control line receives the ground voltage, and the erase line receives the erase voltage, wherein the magnitude of the erase voltage is higher than a magnitude of the inhibit voltage, and the magnitude of the inhibit voltage is higher than the magnitude of the ground voltage.

3. A multi-time programming memory cell, comprising:
   a floating gate transistor with a floating gate;
   a first transistor, wherein a first terminal of the first transistor is connected with a source line, a second terminal of the first transistor is connected with a first terminal of the floating gate transistor, and a gate terminal of the first transistor is connected with a select gate line;
   a second transistor, wherein a first terminal of the second transistor is connected with a second terminal of the floating gate transistor, a second terminal of the second transistor is connected with a bit line, and a gate terminal of the second transistor is connected with a word line;
   a first capacitor, wherein a first terminal of the first capacitor is connected with the floating gate, and a second terminal of the first capacitor is connected with an erase line;
   a second capacitor, wherein a first terminal of the second capacitor is connected with the floating gate, and a second terminal of the second capacitor is connected with a control line; and
   a third capacitor, wherein a first terminal of the third capacitor is connected with the floating gate, and a second terminal of the third capacitor is connected with an inhibit line;
   wherein while an erase operation is performed on the multi-time programming memory cell, the source line receives a ground voltage, the bit line receives the ground voltage, the select gate line receives a first power voltage, the word line receives the first power voltage, the inhibit line receives the ground voltage, the control line receives the ground voltage, and the erase line receives an erase voltage, wherein a magnitude of the erase voltage is higher than a magnitude of the first power voltage, and the magnitude of the first power voltage is higher than a magnitude of the ground voltage.

4. The multi-time programming memory cell as claimed in claim 3, wherein while an erase inhibit operation is performed on the multi-time programming memory cell, the source line receives the ground voltage, the bit line receives the ground voltage, the select gate line receives the first power voltage, the word line receives the first power voltage, the inhibit line receives the ground voltage, the control line receives the ground voltage, and the erase line receives the ground voltage.

5. The multi-time programming memory cell as claimed in claim 3, comprising:
   a first well region;
   a second well region;
   a third well region;
   a fourth well region;

a first gate structure located over the fourth well region;
a second gate structure located over the first well region, the second well region, the third well region and the fourth well region;
a third gate structure located over the fourth well region;
a first doped region, a second doped region, a third doped region and a fourth doped region formed in the fourth well region, wherein the first transistor is defined by the first doped region, the second doped region and the first gate structure collaboratively, the floating gate transistor is defined by the second doped region, the third doped region and the second gate structure collaboratively, the second transistor is defined by the third doped region, the fourth doped region and the third gate structure collaboratively, wherein the first doped region is arranged beside the first gate structure, the second doped region is arranged between the first gate structure and the second gate structure, the third doped region is arranged between the second gate structure and the third gate structure, and the fourth doped region is arranged beside the third gate structure;
a fifth doped region and a sixth doped region formed in the first well region, wherein the first capacitor is defined by the fifth doped region, the sixth doped region and the second gate structure collaboratively, wherein the fifth doped region and the sixth doped region are arranged beside two sides of the second gate structure, respectively, and the fifth doped region and the sixth doped region are connected with the erase line;
a seventh doped region and an eighth doped region formed in the second well region, wherein the second capacitor is defined by the seventh doped region, the eighth doped region and the second gate structure collaboratively, wherein the seventh doped region and the eighth doped region are arranged beside the two sides of the second gate structure, respectively, and the seventh doped region and the eighth doped region are connected with the control line; and
a ninth doped region and a tenth doped region formed in the third well region, wherein the third capacitor is defined by the ninth doped region, the tenth doped region and the second gate structure collaboratively, wherein the ninth doped region and the tenth doped region are arranged beside the two sides of the second gate structure, respectively, and the ninth doped region and the tenth doped region are connected with the inhibit line.

6. The multi-time programming memory cell as claimed in claim 5, wherein the second gate structure comprises a floating gate, a coupling gate, an erase gate and an inhibit gate.

7. The multi-time programming memory cell as claimed in claim 6, wherein a first active region of the inhibit gate is arranged between the ninth doped region and the tenth doped region, a second active region of the coupling gate is arranged between the seventh doped region and the eighth doped region, a third active region of the floating gate is arranged between the second doped region and the third doped region, and a fourth active region of the erase gate is arranged between the fifth doped region and the sixth doped region.

8. The multi-time programming memory cell as claimed in claim 7, wherein an area of the first active region is larger than an area of the third active region, an area of the second active region is larger than the area of the third active region, and the area of the third active region is larger than an area of the fourth active region.

9. A memory cell array comprising a first row of M multi-time programming memory cells, wherein the M multi-time programming memory cells in the first row are connected with a first select gate line, a first word line, a first control line and a first erase line, the M multi-time programming memory cells in the first row are respectively connected with corresponding M source lines, and the M multi-time programming memory cells in the first row are respectively connected with corresponding M bit lines, wherein N multi-time programming memory cells of the M multi-time programming memory cells in the first row are connected with a first inhibit line, and (M-N) multi-time programming memory cells of the M multi-time programming memory cells in the first row are connected with a second inhibit line.

10. The memory cell array as claimed in claim 9, further comprising a second row of M multi-time programming memory cells, wherein the M multi-time programming memory cells in the second row are connected with a second select gate line, a second word line, a second control line and a second erase line, the M multi-time programming memory cells in the second row are respectively connected with the corresponding M source lines, and the M multi-time programming memory cells in the second row are respectively connected with the corresponding M bit lines, wherein the N multi-time programming memory cells of the M multi-time programming memory cells in the second row are connected with the first inhibit line, and (M-N) multi-time programming memory cells of the M multi-time programming memory cells in the second row are connected with the second inhibit line.

11. The memory cell array as claimed in claim 9, wherein a first multi-time programming memory cell of the M multi-time programming memory cells in the first row comprises:
a first transistor, wherein a first terminal of the first transistor is connected with the first source line, and a gate terminal of the first transistor is connected with the first select gate line;
a floating gate transistor with a floating gate, wherein a first terminal of the floating gate transistor is connected with a second terminal of the first transistor;
a second transistor, wherein a first terminal of the second transistor is connected with a second terminal of the floating gate transistor, a second terminal of the second transistor is connected with the first bit line, and a gate terminal of the second transistor is connected with the first word line;
a first capacitor, wherein a first terminal of the first capacitor is connected with the floating gate, and a second terminal of the first capacitor is connected with the first erase line;
a second capacitor, wherein a first terminal of the second capacitor is connected with the floating gate, and a second terminal of the second capacitor is connected with the first control line; and
a third capacitor, wherein a first terminal of the third capacitor is connected with the floating gate, and a second terminal of the third capacitor is connected with the first inhibit line.

12. The memory cell array as claimed in claim 9, wherein when the M source lines receive a first power voltage, the M bit lines receive a ground voltage, the first select gate line receives the ground voltage, the first word line receives the ground voltage or the first power voltage, the first control line receives the ground voltage, the first erase line receives an erase voltage and the first inhibit line receives the ground voltage, an erase operation is performed on the N multi-time programming memory cells of the M multi-time programming memory cells in the first row, wherein a magnitude of the erase voltage is higher than a magnitude of the first power voltage, and the magnitude of the first power voltage is higher than a magnitude of the ground voltage.

13. The memory cell array as claimed in claim 12, wherein when the M source lines receive the first power voltage, the M bit lines receive the ground voltage, the first select gate line receives the ground voltage, the first word line receives the ground voltage or the first power voltage, the first control line receives the ground voltage, the first erase line receives the erase voltage and the second inhibit line receives an inhibit voltage, an erase inhibit operation is performed on the (M-N) multi-time programming memory cells of the M multi-time programming memory cells in the first row, wherein the magnitude of the erase voltage is higher than a magnitude of the inhibit voltage, and the magnitude of the inhibit voltage is higher than the magnitude of the ground voltage.

14. A memory cell array comprising a first row of M multi-time programming memory cells, wherein the M multi-time programming memory cells in the first row are connected with a first select gate line, a first word line and a first control line, the M multi-time programming memory cells in the first row are respectively connected with corresponding M source lines, and the M multi-time programming memory cells in the first row are respectively connected with corresponding M bit lines, wherein N multi-time programming memory cells of the M multi-time programming memory cells in the first row are connected with a first inhibit line and a first erase line, and (M-N) multi-time programming memory cells of the M multi-time programming memory cells in the first row are connected with a second inhibit line and a second erase line.

15. The memory cell array as claimed in claim 14, further comprising a second row of M multi-time programming memory cells, wherein the M multi-time programming memory cells in the second row are connected with a second select gate line, a second word line and a second control line, the M multi-time programming memory cells in the second row are respectively connected with the corresponding M source lines, and the M multi-time programming memory cells in the second row are respectively connected with the corresponding M bit lines, wherein the N multi-time programming memory cells of the M multi-time programming memory cells in the second row are connected with the first inhibit line and a third erase line, and (M-N) multi-time programming memory cells of the M multi-time programming memory cells in the second row are connected with the second inhibit line and a fourth erase line.

16. The memory cell array as claimed in claim 14, wherein a first multi-time programming memory cell of the M multi-time programming memory cells in the first row comprises:
a first transistor, wherein a first terminal of the first transistor is connected with the first source line, and a gate terminal of the first transistor is connected with the first select gate line;
a floating gate transistor with a floating gate, wherein a first terminal of the floating gate transistor is connected with a second terminal of the first transistor;
a second transistor, wherein a first terminal of the second transistor is connected with a second terminal of the floating gate transistor, a second terminal of the second transistor is connected with the first bit line, and a gate terminal of the second transistor is connected with the first word line;
a first capacitor, wherein a first terminal of the first capacitor is connected with the floating gate, and a second terminal of the first capacitor is connected with the first erase line;
a second capacitor, wherein a first terminal of the second capacitor is connected with the floating gate, and a second terminal of the second capacitor is connected with the first control line; and
a third capacitor, wherein a first terminal of the third capacitor is connected with the floating gate, and a second terminal of the third capacitor is connected with the first inhibit line.

17. The memory cell array as claimed in claim 14, wherein when the M source lines receive a ground voltage, the M bit lines receive the ground voltage, the first select gate line receives a first power voltage, the first word line receives the first power voltage, the first control line receives the ground voltage, the first inhibit line receives the ground voltage and the first erase line receives an erase voltage, an erase operation is performed on the N multi-time programming memory cells of the M multi-time programming memory cells in the first row, wherein a magnitude of the erase voltage is higher than a magnitude of the first power voltage, and the magnitude of the first power voltage is higher than a magnitude of the ground voltage.

18. The memory cell array as claimed in claim 17, wherein when the M source lines receive the ground voltage, the M bit lines receive the ground voltage, the first select gate line receives the first power voltage, the first word line receives the first power voltage, the first control line receives the ground voltage, the first inhibit line receives the ground voltage and the first erase line receives the ground voltage, an erase inhibit operation is performed on the (M-N) multi-time programming memory cells of the M multi-time programming memory cells in the first row.

* * * * *